United States Patent
Ichiki et al.

(10) Patent No.: US 6,861,642 B2
(45) Date of Patent: *Mar. 1, 2005

(54) NEUTRAL PARTICLE BEAM PROCESSING APPARATUS

(75) Inventors: Katsunori Ichiki, Kanagawa (JP); Kazuo Yamauchi, Kanagawa (JP); Hirokuni Hiyama, Kanagawa (JP); Seiji Samukawa, Miyagi (JP)

(73) Assignee: Ebara Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/451,633
(22) PCT Filed: Mar. 22, 2002
(86) PCT No.: PCT/JP02/02750
§ 371 (c)(1), (2), (4) Date: Dec. 2, 2003
(87) PCT Pub. No.: WO02/078041
PCT Pub. Date: Oct. 3, 2002

(65) Prior Publication Data
US 2004/0070348 A1 Apr. 15, 2004

(30) Foreign Application Priority Data
Mar. 26, 2001 (JP) ....................... 2001-088866

(51) Int. Cl.[7] .............................. H05H 3/00
(52) U.S. Cl. ............... 250/251; 250/492.2; 250/492.22; 250/492.23; 250/492.3
(58) Field of Search .............................. 250/251, 492.2, 250/492.22, 492.23, 492.3; 315/111.21, 111.81; 156/345.38

(56) References Cited

U.S. PATENT DOCUMENTS

| | | | | | |
|---|---|---|---|---|---|
| 5,284,544 | A | * | 2/1994 | Mizutani et al. | ........ 156/345.38 |
| 6,291,940 | B1 | * | 9/2001 | Scholte Van Mast | ... 315/111.81 |

FOREIGN PATENT DOCUMENTS

| EP | 0 531 949 A2 | 3/1993 |
|---|---|---|
| EP | 0 790 757 A1 | 8/1997 |

* cited by examiner

*Primary Examiner*—Frank G. Font
*Assistant Examiner*—Mary El-Shammaa
(74) *Attorney, Agent, or Firm*—Westerman, Hattori, Daniels & Adrian, LLP

(57) ABSTRACT

A neutral particle beam processing apparatus comprises a workpiece holder (20) for holding a workpiece (X), a plasma generator for generating a plasma in a vacuum chamber (3), an orifice electrode (5) disposed between the workpiece holder (20) and the plasma generator, and a grid electrode (4) disposed upstream of the orifice electrode (5) in the vacuum chamber (3). The orifice electrode (5) has orifices (5a) defined therein. The neutral particle beam processing apparatus further comprises a voltage applying unit for applying a voltage between the orifice electrode (5) and the grid electrode (4) via a dielectric (5b) to extract positive ions from the plasma generated by the plasma generator and pass the extracted positive ions through the orifices (5a) in the orifice electrode (5).

4 Claims, 5 Drawing Sheets

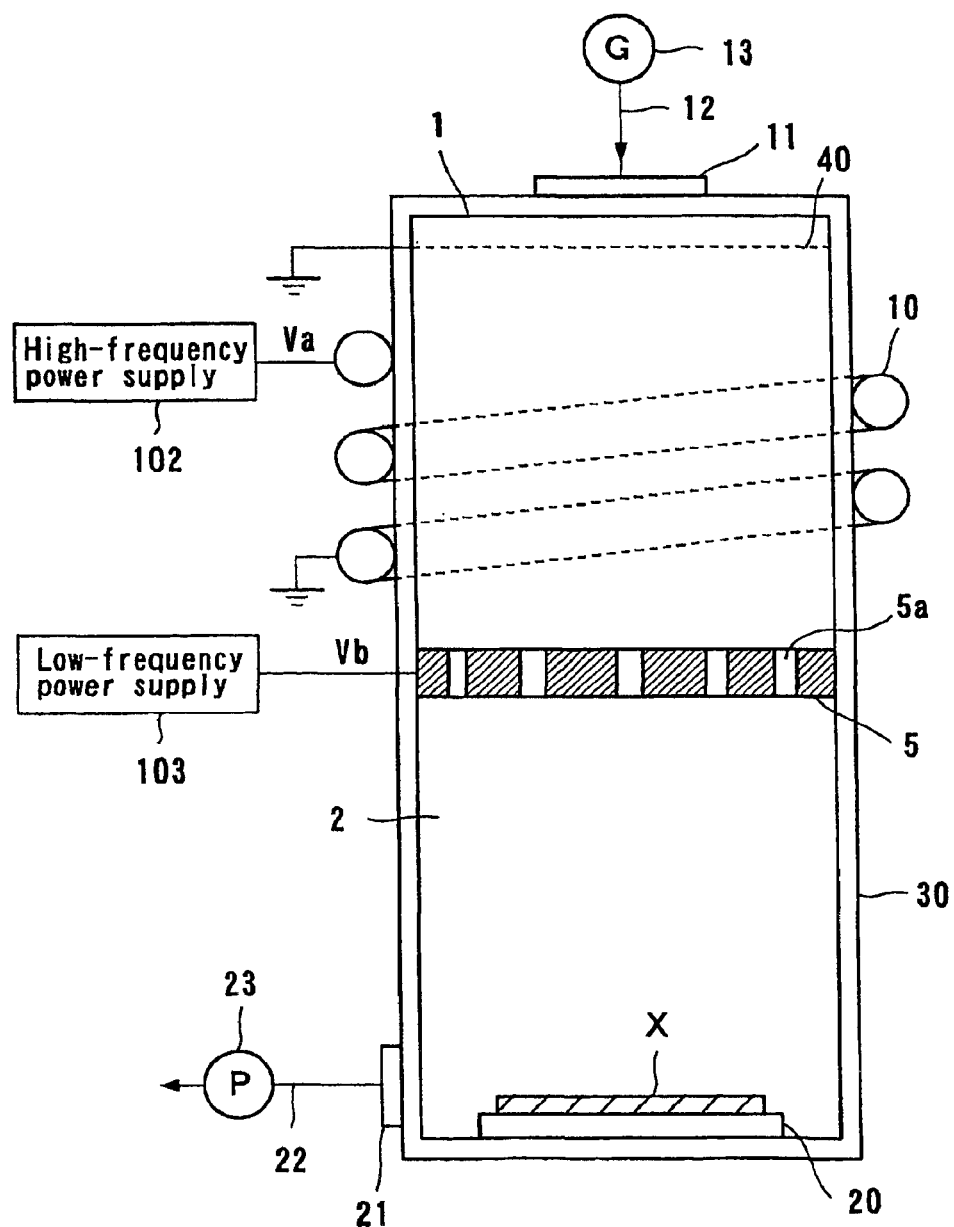
F I G. 4

NEUTRAL PARTICLE BEAM PROCESSING APPARATUS

TECHNICAL FIELD

The present invention relates to a neutral particle beam processing apparatus, and more particularly to a neutral particle beam processing apparatus for generating a highly directional and highly dense neutral particle beam from a high-density plasma and processing a workpiece with the generated neutral particle beam.

BACKGROUND ART

In recent years, semiconductor integrated circuits, information storage media such as hard disks, micromachines, and the like have been processed in highly fine patterns. In the fields of processing such workpieces, attention has been attracted to the use of an energetic beam such as a high-density ion beam which is highly linear, i.e., highly directional, and has a relatively large beam diameter. For example, the energetic beam is applied to a workpiece for depositing a film thereon or etching the workpiece.

As beam sources of such energetic beams, there have been used beam generators which generate various kinds of beams including a positive ion beam, a negative ion beam, and a radical beam. The positive ion beam, the negative ion beam, or the radical beam is applied to a desired area of a workpiece from the beam source, for thereby locally depositing a film on the workpiece, etching the workpiece, modifying the surface of the workpiece, or joining or bonding parts of the workpiece.

In the case of a beam source which applies charged particles such as positive ions or negative ions to a workpiece, an insulated workpiece cannot be processed because of a charge build-up phenomenon in which electric charges are built up on the workpiece. Further, since the ion beam emitted from the beam source tends to spread due to the space-charge effect, the workpiece cannot be processed in a fine pattern.

In order to solve the above problems, there has been proposed a method of introducing electrons into the ion beam to neutralize the electric charges. This method can balance the electric charges on the workpiece on the whole. However, since local unbalance of the electric charges still remains on the workpiece, the workpiece cannot be processed in a fine pattern.

In the case where ions are extracted from a plasma source and applied to a workpiece, if radiation (e.g., an ultraviolet ray) produced by the plasma source is applied to the workpiece, then the radiation adversely affects the workpiece. Thus, it is necessary to shield the workpiece from adverse radiation (e.g., an ultraviolet ray) emitted from the plasma source.

DISCLOSURE OF INVENTION

The present invention has been made in view of the above drawbacks. It is therefore an object of the present invention to provide a neutral particle beam processing apparatus which can apply an energetic beam having a large beam diameter to a workpiece with an inexpensive and compact structure, and can neutralize ions with a high neutralization efficiency to process the workpiece without a charge build-up or damage.

According to a first aspect of the present invention, there is provided a neutral particle beam processing apparatus comprising: a workpiece holder for holding a workpiece; a plasma generator for generating a plasma in a vacuum chamber; an orifice electrode disposed between the workpiece holder and the plasma generator, the orifice electrode having orifices defined therein; a grid electrode disposed upstream of the orifice electrode in the vacuum chamber; and a voltage applying unit for applying a voltage between the orifice electrode and the grid electrode via a dielectric to extract positive ions from the plasma generated by the plasma generator and pass the extracted positive ions through the orifices in the orifice electrode.

With the above arrangement, since the workpiece can be processed by a neutral particle beam having no electric charges but having a large translational energy, various processes including an etching process and a deposition process can be performed on the workpiece with high accuracy in such a state that an amount of charge build-up is reduced. Particularly, when the orifice electrode is used for neutralizing the negative ions, a high neutralization efficiency can be obtained, and hence a beam diameter of an energetic beam can be increased inexpensively without increasing the size of the apparatus. Further, since the generated plasma is isolated from the workpiece by the orifice electrode, a radiation produced by the plasma is not substantially applied to the workpiece. Therefore, it is possible to reduce adverse effects on the workpiece due to the radiation such as an ultraviolet ray which would otherwise damage the workpiece.

According to a second aspect of the present invention, there is provided a neutral particle beam processing apparatus comprising: a workpiece holder for holding a workpiece; a plasma generator for generating a plasma in a vacuum chamber; an orifice electrode disposed between the workpiece holder and the plasma generator, the orifice electrode having orifices defined therein; a grid electrode disposed upstream of the orifice electrode in the vacuum chamber; and a voltage applying unit for applying a high-frequency voltage between the orifice electrode and the grid electrode via a dielectric to generate a plasma between the orifice electrode and the grid electrode and to extract positive ions from the generated plasma and pass the extracted positive ions through the orifices in the orifice electrode.

With the above arrangement, the orifice electrode serves not only to neutralize the positive ions, but also to generate the plasma. Therefore, a high neutralization efficiency can be obtained by the orifice electrode, and simultaneously it is not necessary to provide a separate plasma generator for generating a plasma. Thus, the neutral particle beam processing apparatus can be made compact in structure, and a beam diameter of an energetic beam can be increased inexpensively.

According to a preferred aspect of the present invention, the dielectric comprises a dielectric film covering a surface of the orifice electrode. When the surface of the orifice electrode is covered with a dielectric film, more electrons are charged on the dielectric film with weak bonding energies than usual. Therefore, the positive ions that are passing through the orifices have a higher probability of recombination with the electrons. Accordingly, the neutralization efficiency of positive ions can further be enhanced.

The above and other objects, features, and advantages of the present invention will be apparent from the following description when taken in conjunction with the accompanying drawings which illustrates preferred embodiments of the present invention by way of example.

BRIEF DESCRIPTION OF DRAWINGS

FIG. 4 is a schematic view showing a whole arrangement of a neutral particle beam processing apparatus according to a second embodiment of the present invention;

BEST MODE FOR CARRYING OUT THE INVENTION

A neutral particle beam processing apparatus according to a first embodiment of the present invention will be described in detail below with reference to FIGS. 1 through 3.

Figure 1:
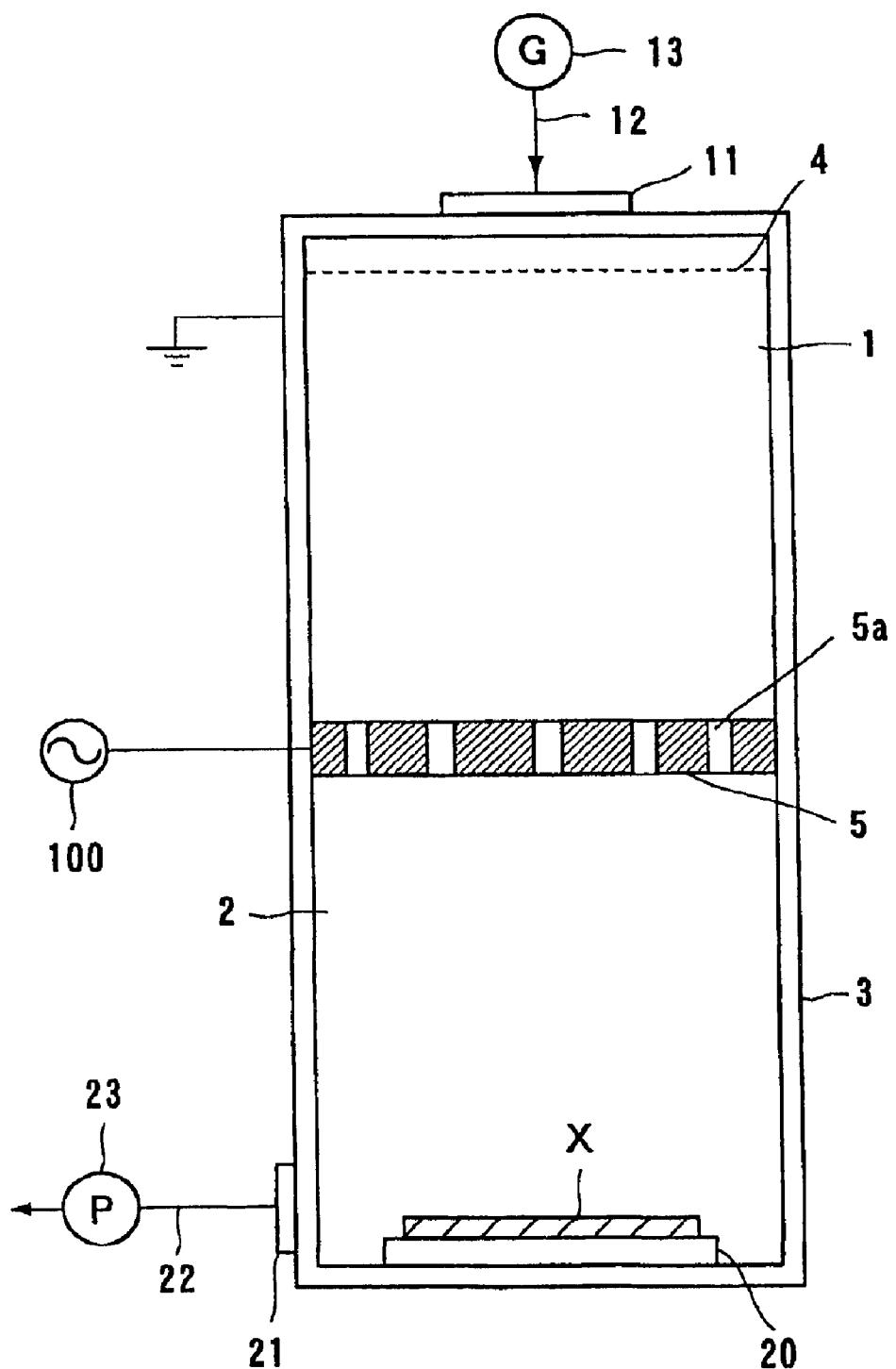
FIG. 1 is a schematic view showing a whole arrangement of a neutral particle beam processing apparatus according to a first embodiment of the present invention.

FIG. 1 is a schematic view showing a whole arrangement of a neutral particle beam processing apparatus according to a first embodiment of the present invention, with electric components in block form. As shown in FIG. 1, the neutral particle beam processing apparatus comprises a cylindrical vacuum chamber 3 constituted by a beam generating chamber 1 for generating a neutral particle beam and a process chamber 2 for processing a workpiece X such as a semiconductor substrate, a glass workpiece, an organic workpiece, a ceramic workpiece, or the like. The vacuum chamber 3 is a metallic chamber, which is made of metal, and a thin-plate grid electrode 4 made of an electrically conductive material is disposed in an upstream end of the vacuum chamber 3. The vacuum chamber 3 and the grid electrode 4 are electrically connected to each other and electrically grounded. The grid electrode 4 may comprise a meshed wire, a punching metal, or the like.

The beam generating chamber 1 has a gas inlet port 11 defined in an upper portion thereof for introducing a gas into the beam generating chamber 1. The gas inlet port 11 is connected through a gas supply pipe 12 to a gas supply source 13, which supplies a gas such as $SF_6$, $CHF_3$, $CF_4$, $Cl_2$, Ar, $O_2$, $N_2$, and $C_4F_8$ to the beam generating chamber 1.

The process chamber 2 houses a workpiece holder 20 therein for holding a workpiece X. The workpiece X is placed on an upper surface of the workpiece holder 20. The process chamber 2 has a gas outlet port 21 defined in a sidewall thereof for discharging the gas from the process chamber 2. The gas outlet port 21 is connected through a gas outlet pipe 22 to a vacuum pump 23, which operates to maintain the process chamber 2 at a predetermined pressure.

An orifice plate (orifice electrode) 5 made of an electrically conductive material such as aluminum is disposed in the lower end of the beam generating chamber 1. The orifice electrode 5 is electrically connected to an AC power supply (voltage applying unit) 100. The vacuum chamber 3 and the orifice electrode 5 are electrically insulated from each other by an insulating material (not shown).

Figure 2A:
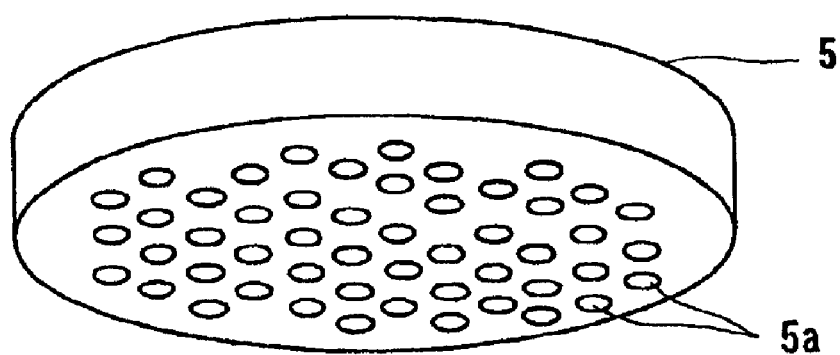
FIG. 2A is a perspective view showing an orifice electrode in the neutral particle beam processing apparatus shown in FIG. 1.
Figure 2B:
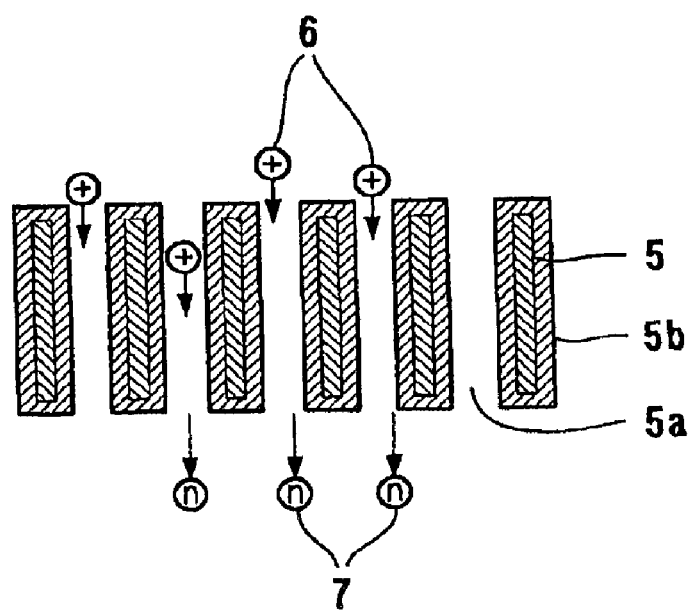
FIG. 2B is a vertical cross-sectional view partially showing the orifice electrode shown in FIG. 2A.
Figure 3:
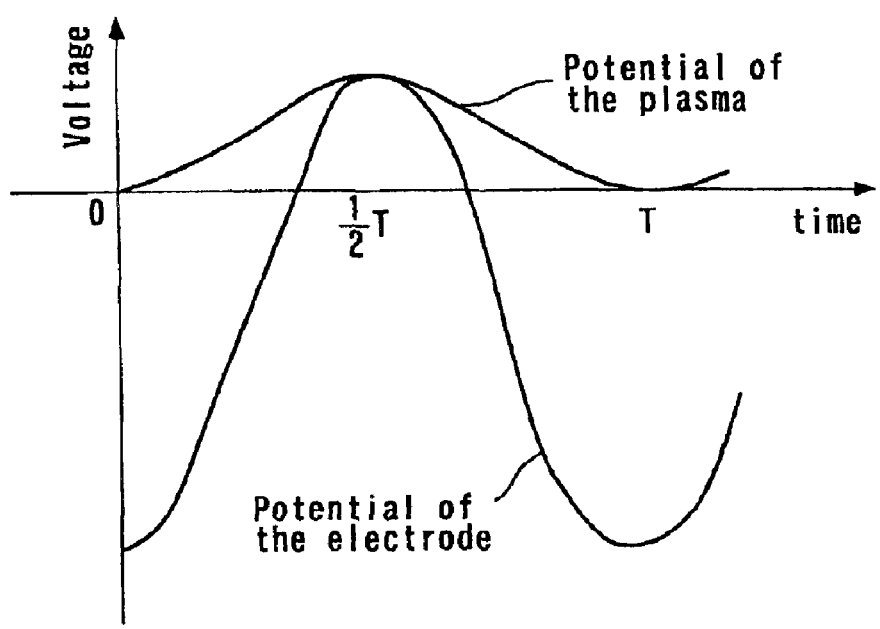
FIG. 3 is a graph showing the potential of a plasma and the potential of the orifice electrode in the first embodiment of the present invention.

FIG. 2A is a perspective view showing the orifice electrode 5, and FIG. 2B is a vertical cross-sectional view partially showing the orifice electrode 5 shown in FIG. 2A. As shown in FIGS. 2A and 2B, the orifice electrode 5 has a number of orifices 5a defined therein. As shown in FIG. 2B, the surfaces of the orifice electrode 5 are covered with dielectric films 5b. The dielectric films 5b may comprise aluminum oxide films. Alternatively, the dielectric films 5b may comprise nitride films or oxide films which are formed on a silicon material or dielectric films spray-coated on an electrically conductive material.

Operation of the neutral particle beam processing apparatus according to the first embodiment will be described below. FIG. 3 is a graph showing the potential of the plasma and the potential of the orifice electrode 5 in the present embodiment. In FIG. 3, T represents the period of the potentials.

The vacuum pump 23 is driven to evacuate the vacuum chamber 3, and then a gas such as $SF_6$, $CHF_3$, $CF_4$, $Cl_2$, Ar, $O_2$, $N_2$, or $C_4F_8$ is introduced from the gas supply source 13 into the beam generating chamber 1. A high-frequency voltage having a frequency of about 13.56 MHz is applied to the orifice electrode 5, so that a high-frequency electric field is produced in the beam generating chamber 1. The gas introduced into the beam generating chamber 1 is ionized by electrons that are accelerated by the high-frequency electric field, for thereby generating a high-density plasma in the beam generating chamber 1. The plasma is mainly composed of positive ions and heated electrons.

At this time, since the electrons, which move 1000 times faster than the ions, reach a cathode earlier than the ions to negatively charge the cathode. This potential attracts the positive ions to the cathode. Since the orifice electrode 5 is electrically insulated by the dielectric films 5b, the surfaces of the dielectric films 5b of the orifice electrode 5 are charged with the electrons. Therefore, after several cycles of the high-frequency electric field, a steady state is established to prevent electrons from excessively passing through the orifice electrode 5. Thus, a sheath is formed upstream of the orifice electrode 5. The positive ions are accelerated by an average potential (self-bias) of the sheath.

Then, the positive ions 6 (see FIG. 2B) accelerated by the sheath are introduced into the orifices 5a defined in the orifice electrode 5. Most of the positive ions 6 that are passing through the orifices 5a in the orifice electrode 5 are collided with the sidewall surfaces of the orifices 5a and hence neutralized in the vicinity of solid sidewall surfaces of the orifices 5a, or are collided with gas molecules remaining within the orifices 5a and hence neutralized by charge exchange with the gas molecules, or are collided with electrons charged on the dielectric films 5b of the orifice electrode 5 and hence neutralized by recombination with the electrons. Thus, the positive ions 6 are converted into neutral particles 7 (see FIG. 2B). Since the dielectric films 5b are formed on the orifice electrode 5, more electrons are charged on the dielectric films 5b than usual. Therefore, the positive ions 6 that are passing through the orifices 5a have a higher probability of recombination with the electrons. Accordingly, a neutralization efficiency of positive ions can be enhanced.

The positive ions 6 that have been neutralized when passing through the orifices 5a, i.e., the neutral particles 7, are then emitted as an energetic beam into the process chamber 2. The neutral particles 7 travel directly in the process chamber 2 and are applied to the workpiece X placed on the workpiece holder 20, for thereby etching the surface of the workpiece X, cleaning the surface of the workpiece X, modifying (e.g., nitriding or oxidizing) the surface of the workpiece X, or depositing a film on the workpiece X.

The orifice electrode 5 serves not only to neutralize the positive ions, but also to prevent a radiation produced by the plasma from being applied to the workpiece X. Specifically, since the beam generating chamber 1 where the plasma is generated is isolated from the workpiece X by the orifice electrode 5, the radiation produced by the plasma is not substantially applied to the workpiece X. Therefore, it is possible to reduce adverse effects on the workpiece X due to the radiation such as an ultraviolet ray which would otherwise damage the workpiece X.

As well known in the art, when an insulated workpiece such as a workpiece made of glass or ceramics is processed, charge build-up may be developed on the surface of the insulated workpiece. However, by applying neutralized particles to the insulating workpiece as described above, various processes including an etching process and a deposition process can be performed on the insulating workpiece with high accuracy in such a state that an amount of charge build-up is reduced. Various types of gases may be introduced into the beam generating chamber 1 according to the type of process to be performed on the workpiece X. For example, in a dry etching process, oxygen or a halogen gas may selectively be used according to the kind of the workpiece X.

Figure 5:
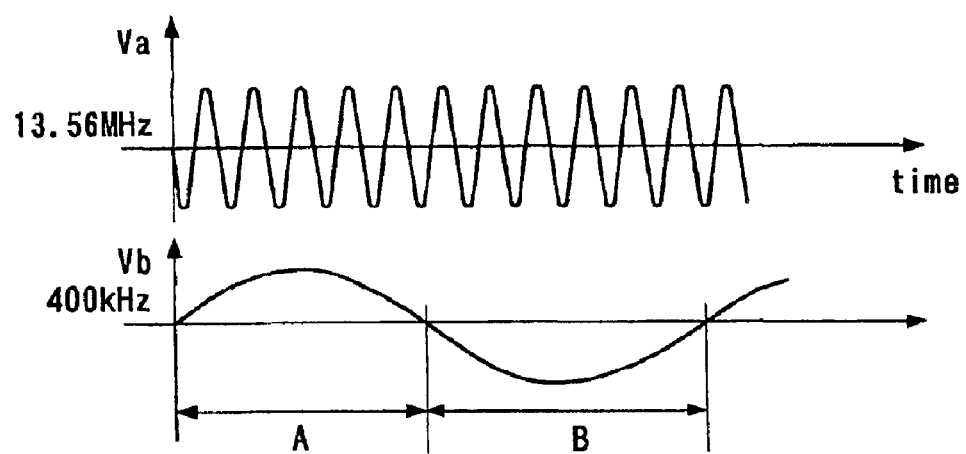
FIG. 5 is a timing chart showing operating states of the neutral particle beam processing apparatus shown in FIG. 4.

A neutral particle beam processing apparatus according to a second embodiment of the present invention will be described below with reference to FIGS. 4 and 5. FIG. 4 is a schematic view showing a whole arrangement of a neutral particle beam processing apparatus according to a second embodiment of the present invention, with electric components in block form. In FIG. 4, like parts and components are denoted by the same reference numerals and characters as those of the first embodiment and will not be described below.

While the vacuum chamber is a metallic chamber in the first embodiment, a vacuum chamber in the second embodiment comprises a beam generating chamber 1 having walls made of quartz glass or ceramics, and a process chamber 2 having walls made of metal. The beam generating chamber 1 has a coil 10 disposed therearound for inductively coupled plasma (ICP). The coil 10 is housed in a water-cooled tube having an outside diameter of 8 mm, for example. The coil 10 of about two turns is wound around the beam generating chamber 1. The coil 10 is electrically connected to a high-frequency power supply 102, which applies a high-frequency voltage having a frequency of about 13.56 MHz, for example, to the coil 10. When a high-frequency current is supplied from the high-frequency power supply 102 to the coil 10, an induced magnetic field is produced in the beam generating chamber 1 by the coil 10. The varying magnetic field induces an electric field. The electric field accelerates electrons, which ionizes atoms and molecules in a gas to generate a plasma in the beam generating chamber 1. Thus, the coil 10 and the high-frequency power supply 102 constitute a plasma generator for generating a plasma in the beam generating chamber 1.

The orifice electrode 5 is electrically connected to a low-frequency power supply (voltage applying unit) 103, which applies a low-frequency voltage having a frequency of about 400 kHz, for example, to the orifice electrode 5. A thin-plate grid electrode 40 made of an electrically conductive material is disposed upstream of the coil 10 and electrically grounded.

Operation of the neutral particle beam processing apparatus according to the second embodiment will be described below. FIG. 5 is a timing chart showing operating states of the neutral particle beam processing apparatus shown in FIG. 4. In FIG. 5, Va represents the potential of the coil 10, and Vb represents the potential of the orifice electrode 5. The timing chart is schematically shown in FIG. 5, and the shown frequencies are different from the actual frequencies, for example.

The vacuum pump 23 is driven to evacuate the vacuum chamber 3, and then a gas is introduced from the gas supply source 13 into the beam generating chamber 1. As shown in FIG. 5, a high-frequency voltage having a frequency of about 13.56 MHz is applied to the coil 10 by the high-frequency power supply 102, so that a high-frequency electric field is produced in the beam generating chamber 1. The gas introduced into the beam generating chamber 1 is ionized by electrons that are accelerated by the high-frequency electric field, for thereby generating a high-density plasma in the beam generating chamber 1.

At the same time when the high-frequency voltage is applied by the high-frequency power supply 102, a low-frequency voltage having a frequency of about 400 kHz is applied between the grid electrode 40 and the orifice electrode 5 by the low-frequency power supply 103. When a positive voltage is applied to the orifice electrode 5 (for example, during a period "A" illustrated in FIG. 5), electrons in the generated plasma is attracted to the orifice electrode 5 to charge the surfaces of the orifice electrode 5 with the electrons. When a negative voltage is applied to the orifice electrode 5 (for example, during a period "B" illustrated in FIG. 5), positive ions in the generated plasma is attracted to the orifice electrode 5 and pass through the orifice 5a defined in the orifice electrode 5. Most of the positive ions that are passing through the orifices 5a are neutralized and converted into neutral particles as in the case of the first embodiment. The neutral particles are then emitted as an energetic beam into the process chamber 2. The neutral particles travel directly in the process chamber 2 and are applied to the workpiece X placed on the workpiece holder 20.

Figure 6:
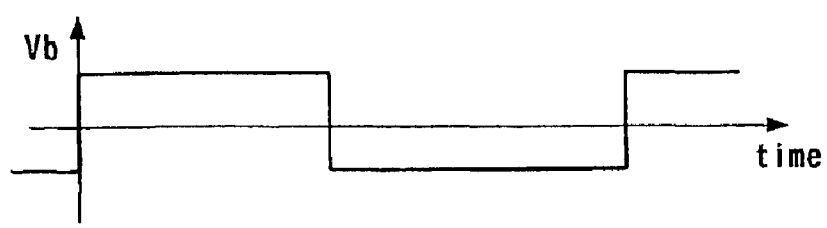
FIG. 6 is a timing chart showing an example of a voltage to be applied instead of a low-frequency voltage.

In the present embodiment, the plasma is generated with use of a coil for ICP. However, the plasma may be generated with use of an electron cyclotron resonance source (ECR source), a coil for helicon wave plasma, a microwave, or the like. The frequency of the high-frequency voltage is not limited to 13.56 MHz, but may be in the range from 1 MHz to 20 GHz. Further, the frequency of the high-frequency voltage is not limited to 400 kHz. For example, a voltage of a rectangular wave as shown in FIG. 6 may be applied instead of the low-frequency voltage.

In the above embodiments, the dielectric films are formed on the orifice electrode. As a dielectric, a blocking capacitor may be inserted between the AC power supply 100 and the orifice electrode 5 in FIG. 1 or between the low-frequency power supply 103 and the orifice electrode 5 in FIG. 4.

Although certain preferred embodiments of the present invention have been shown and described in detail, it should be understood that various changes and modifications may be made therein without departing from the scope of the appended claims.

INDUSTRIAL APPLICABILITY

The present invention is suitable for use in a neutral particle beam processing apparatus for generating a highly directional and highly dense neutral particle beam from a high-density plasma and processing a workpiece with the generated neutral particle beam.

What is claimed is:

1. A neutral particle beam processing apparatus comprising:
a workpiece holder for holding a workpiece;

a plasma generator for generating a plasma in a vacuum chamber;

an orifice electrode disposed between said workpiece holder and said plasma generator, said orifice electrode having orifices defined therein;

a grid electrode disposed upstream of said orifice electrode in said vacuum chamber; and a voltage applying unit for applying a voltage between said orifice electrode and said grid electrode via a dielectric to extract positive ions from the plasma generated by said plasma generator and pass the extracted positive ions through said orifices in said orifice electrode.

2. A neutral particle beam processing apparatus according to claim 1, wherein said dielectric comprises a dielectric film covering a surface of said orifice electrode.

3. A neutral particle beam processing apparatus comprising:

a workpiece holder for holding a workpiece;

a plasma generator for generating a plasma in a vacuum chamber;

an orifice electrode disposed between said workpiece holder and said plasma generator, said orifice electrode having orifices defined therein;

a grid electrode disposed upstream of said orifice electrode in said vacuum chamber; and a voltage applying unit for applying a high-frequency voltage between said orifice electrode and said grid electrode via a dielectric to generate a plasma between said orifice electrode and said grid electrode and to extract positive ions from the generated plasma and pass the extracted positive ions through said orifices in said orifice electrode.

4. A neutral particle beam processing apparatus according to claim 3, wherein said dielectric comprises a dielectric film covering a surface of said orifice electrode.

* * * * *